United States Patent
Kong

(10) Patent No.: US 12,139,568 B2
(45) Date of Patent: Nov. 12, 2024

(54) HIGH TEMPERATURE, CONDUCTIVE THERMOSETTING RESIN COMPOSITIONS

(71) Applicant: TCLAD INC., Prescott, WI (US)

(72) Inventor: Stanley Shengqian Kong, Hillsborough, NJ (US)

(73) Assignee: TCLAD INC., Prescott, WI (US)

( * ) Notice: Subject to any disclaimer, the term of this patent is extended or adjusted under 35 U.S.C. 154(b) by 749 days.

(21) Appl. No.: 17/418,735

(22) PCT Filed: Dec. 30, 2019

(86) PCT No.: PCT/US2019/068880
§ 371 (c)(1),
(2) Date: Jun. 25, 2021

(87) PCT Pub. No.: WO2020/140109
PCT Pub. Date: Jul. 2, 2020

(65) Prior Publication Data
US 2022/0064352 A1    Mar. 3, 2022

Related U.S. Application Data

(60) Provisional application No. 62/785,940, filed on Dec. 28, 2018.

(51) Int. Cl.
| | | |
|---|---|---|
| C08F 236/14 | (2006.01) | |
| C08K 3/22 | (2006.01) | |
| C08L 47/00 | (2006.01) | |
| C09K 5/14 | (2006.01) | |
| H05K 1/03 | (2006.01) | |
| H05K 1/09 | (2006.01) | |

(52) U.S. Cl.
CPC .............. *C08F 236/14* (2013.01); *C08K 3/22* (2013.01); *C08L 47/00* (2013.01); *C09K 5/14* (2013.01); *H05K 1/0373* (2013.01); *H05K 1/09* (2013.01); *C08K 2003/2227* (2013.01); *C08K 2201/001* (2013.01)

(58) Field of Classification Search
CPC ........... C08F 236/14; C08K 3/22; C08K 5/14; C08K 2003/2227; C08K 2201/001; C08L 47/00; C08L 79/085; H05K 1/0373; H05K 1/09; H05K 1/2201; H05K 1/0209; H05K 2201/0212; H05K 2201/0215; H05K 2201/026; H05K 2201/0323; H05K 2201/083; H05K 1/0346; H05K 1/0326; C08G 59/245; C08G 59/4042; C08G 59/24; C08G 59/40; C08G 73/126; C08G 65/33337

See application file for complete search history.

(56) References Cited

U.S. PATENT DOCUMENTS

| | | |
|---|---|---|
| 4,806,419 A | 2/1989 | Stenzenberger |
| 5,143,969 A | 9/1992 | Reck et al. |
| 6,187,416 B1 | 2/2001 | Satoh |
| 2001/0020071 A1 | 9/2001 | Capote et al. |
| 2011/0187009 A1* | 8/2011 | Masuko .................. H01L 24/27 523/435 |

FOREIGN PATENT DOCUMENTS

| | | |
|---|---|---|
| CN | 107011657 A | 8/2017 |
| CN | 107523055 A | 12/2017 |
| EP | 3321298 A1 | 5/2018 |
| JP | H07206991 A | 8/1995 |

OTHER PUBLICATIONS

C. Gouri et al., "High-Temperature adhesives based on Alder-ene reaction of diallyl bisphenol A novolac and bismaleimide: Effect of BMI structure and novolac molar mass," Polymers & Polymer Composites, Dec. 31, 2003, pp. 311-320, vol. 11, No. 4, US, Polymer Journals.
C. Gouri et al., "High-Temperature Adhesives Based on Alder-ene Reaction of Diallyl Bisphenol A Novolac and Bismaleimide: Effect of BMI Structure and Novolac Molar Mass", 2003, pp. 311-320, vol. 11, No. 4, Polymers & Polymer Composites, US.
Germany Patent Office, Office Action, Patent Application Serial No. 112019006442.8, Jun. 27, 2024, Germany.

* cited by examiner

*Primary Examiner* — Jessica M Roswell

(57) ABSTRACT

The present invention provides high temperature performing, conductive thermosetting resin compositions.

12 Claims, No Drawings

HIGH TEMPERATURE, CONDUCTIVE THERMOSETTING RESIN COMPOSITIONS

BACKGROUND

Field

The present invention provides high temperature performing, conductive thermosetting resin compositions.

Brief Description of Related Technology

Resins with high temperature stability after cure are desired for a variety of commercial applications. For instance, dielectric materials, which store energy electrostatically, are ubiquitous in advanced electronics and electric power systems. Compared to their ceramic counterparts, polymer dielectrics have higher breakdown strengths and greater reliability, are scalable, lightweight and can be shaped into intricate configurations. Therefore, they are an ideal choice for many power electronics, power conditioning, and pulsed power applications. However, polymer dielectrics are oftentimes limited in use to relatively low working temperatures. They are thus failing to satisfy the rising demand for electricity under the extreme conditions present in applications such as hybrid and electric vehicles, aerospace power electronics, and underground oil and gas exploration. [See e.g. Qi Li, et. al., Flexible high-temperature dielectric materials from polymer nanocomposites, Nature, vol 523, 576 (2015).]

In metal-clad printed circuit board ("PCB") applications, the dielectric layer is a thermally conductive composite sandwiched between a printed circuit foil and a metal base plate. Conventional or high temperature epoxies filled with thermally conductive fillers are used in many current applications, including certain high power LED lighting markets.

Due to recent advances in electronics and electric power systems, the operating temperatures of metal-clad PCBs has increased. That temperature increase has the potential to cause degradation of conventional resins used in the various applications on the board. For example, polymer dielectric composites, as well as potting compounds are used in insulated-gate bipolar transistor ("IGBT") power modules. These modules function as switching elements for power converters of variable-speed drives for motors, uninterruptable power supplies, and more. IGBT power modules combine the high-speed switching performance with the high-voltage/current handling capabilities.

In one recent IGBT power module design, a dielectric layer was placed between a 0.5 mm thick copper foil and a copper base plate, creating an Insulated Metal Baseplate structure. [See e.g. K. Ohara et. al., "A New IGBT Module with Insulated Metal Baseplate (IMB) and 7th Generation Chips", PCIM Europe 2015, Nuremberg, Germany (May 19-21, 2015).] Again, in operation the dielectric layer needs to survive high temperature as the operating voltage/current increases in the future. But with resin degradation at higher service temperatures, these power modules may not function properly over time, leading to failures. Clearly, that is not a desired outcome.

In addition, existing high temperature polymeric resins are generally not suitable for use in the manufacturing of metal-clad PCB dielectric layers.

For example, thermoplastic polyimides are well known high temperature dielectric polymers. However, fully imidized polyimides generally have poor solubility across a host of solvents, other than aggressive polar aprotic solvents. To use a polyimide filled with thermally conductive fillers to make the dielectric layer, the solvent chosen needs to be removed before the lamination step. Otherwise, residual solvent may lead to bubble/defect formation.

To complicate matters further, many copper foils are manufactured to have rough surfaces to improve adhesion to substrates like the dielectric layer. Use of a polymeric resin such as a polyimide, with high glass transition temperature and high melt viscosity, may result in poor penetration and wet out of the rough terrain of the copper surfaces. This could impact adversely adhesion.

There is thus a great and longstanding, yet unmet, need for thermosetting resins that can withstand elevated temperatures above 180° C., or even 200° C., permitting uninterrupted function in metal-clad printed circuit board applications or similar applications with comparable demanding performance or in service environments.

SUMMARY

That need has remained unmet. Until now.

The present disclosure satisfies that need by providing the inventive composition, which in one aspect includes:
(a) A resin comprising:
   (i) a first compound having one or more functional groups selected from maleimides, nadimides or itaconimides;
   (ii) a second compound having one or more functional groups selected from maleimides, nadimides or itaconimides, where the second compound is different from the first compound; and
   (iii) an allyl-functionalized phenolic compound;
(b) A thermally conductive filler in an amount of about 0.01 to about 20 weight equivalents of the total resin; and
(c) A solvent selected from cycloalkanones, dialkyl formamides, dialkyl acetamides, and combinations thereof.

The inventive composition in another aspect includes:
(a) A resin comprising:
(i) a first compound having one or more functional groups selected from maleimides, nadimides or itaconimides; and
(ii) an aromatic compound functionalized with one or more ether group(s) and one or more allyl group(s);
(b) A thermally conductive filler in an amount of about 0.01 to about 20 weight equivalents of the total resin; and
(c) A solvent selected from cycloalkanones, dialkyl formamides, dialkyl acetamides, and combinations thereof.

DETAILED DESCRIPTION

As noted above, the inventive composition in one aspect includes:
(a) A resin comprising:
   (i) a first compound having one or more functional groups selected from maleimides, nadimides or itaconimides;
   (ii) a second compound having one or more functional groups selected from maleimides, nadimides or itaconimides, where the second compound is different from the first compound; and
   (iii) an allyl-functionalized phenolic compound;

(b) A thermally conductive filler in an amount of about 0.01 to about 20 weight equivalents of the total resin; and (c) A solvent selected from cycloalkanones, dialkyl formamides, dialkyl acetamides, and combinations thereof.

The resin of (a) comprises:

(i) a first compound having two functional groups selected from maleimides, nadimides or itaconimides;

(ii) a second compound having two functional groups selected from maleimides, nadimides or itaconimides, said second compound being different from the first compound; and (iii) a diallyl-functionalized phenolic compound. The phenolic compound has two hydroxyl groups in addition to two allyl groups.

In a desirable embodiment, the resin of (a) includes:

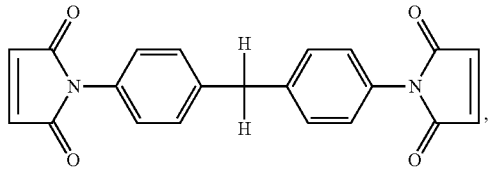

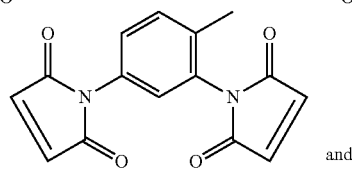
and

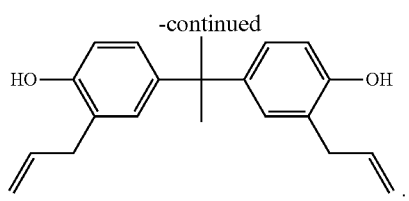

The resin of (a) may include a molar ratio of the first compound (a)(i) and the second compound (a)(ii) to the allyl-functionalized phenolic compound (a)(iii) of from about 1:10 to about 10:1, such as about 1:5 to about 5:1, desirably about 1:2 to about 2:1.

The solvent of (c) may be selected from cycloalkanones, dialkylformamides and dialkylacetamides. For instance, cyclopentanone and cyclohexanone are desirable cycloalkanones, whether individually or in combination; dimethyl formamide is a desirable dialkyl formamide; and dimethyl acetamide is a desirable dialkyl acetamide. Combinations of these solvents may also be suitable.

The solvent of (c) should be present in an amount of about 10 to about 90 percent by weight, based on total composition.

The solvent of (c) has a boiling point of less than or equal about 165° C. at 1 atmosphere pressure. The boiling point of the solvent in some embodiments may be less than or equal to 160° C., desirably 150° C., such as 145° C. at 1 atmosphere pressure.

And as noted above, the inventive composition in another aspect includes:

(a) A resin comprising:

(i) a first compound having one or more functional groups selected from maleimides, nadimides or itaconimides; and (ii) an aromatic compound functionalized with one or more ether group(s) and one or more allyl group(s);

(b) A thermally conductive filler in an amount of about 0.01 to about 20 weight equivalents of the total resin; and (c) A solvent selected from cycloalkanones, dialkyl formamides, dialkyl acetamides, and combinations thereof.

Here, the resin of (a) comprises:

(i) a first compound having two functional groups selected from maleimides, nadimides or itaconimides; and (ii) an aromatic compound functionalized with two ether groups and two allyl groups.

In one embodiment, the resin of (a) comprises:

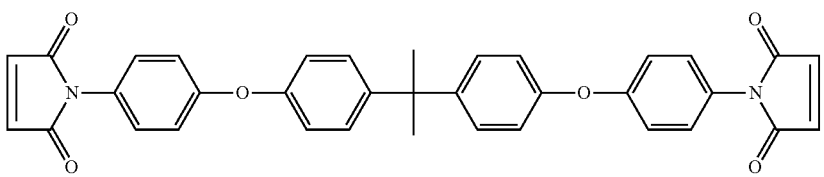 [SMILES: CC(C)(c1ccc(Oc2ccc(N3C(=O)C=CC3=O)cc2)cc1)c1ccc(Oc2ccc(N3C(=O)C=CC3=O)cc2)cc1]

and

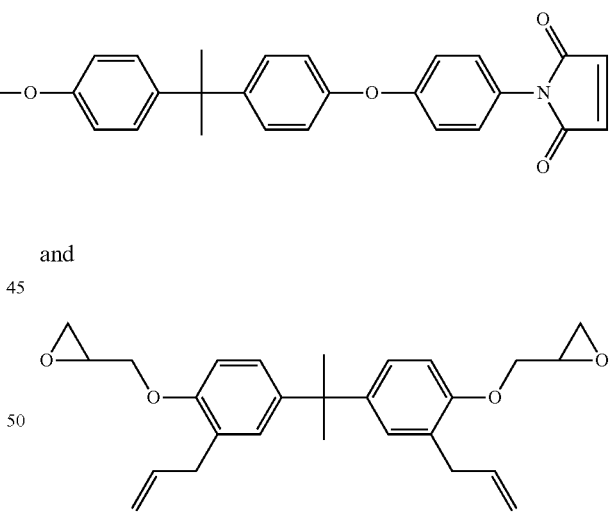

The resin of (a) may comprise a molar ratio of the first compound (a)(i) to the aromatic compound functionalized with one or more ether group(s) and one or more allyl group(s) (a)(ii) is from about 1:10 to about 10:1, such as from about 1:5 to about 5:1, desirably about 1:2 to about 2:1.

The solvent of (c) here is the same solvent as described above. Thus, for brevity, it is not described here again.

The aromatic compound functionalized with one or more ether group(s) and one or more allyl group(s) may be embraced by the following generic structure:

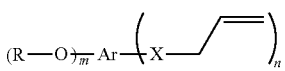

where R is a radical selected from oxetanyl, glycidyl, or $C_{1-4}$ alkyl or $C_{6-10}$ aryl; Ar is an aromatic ring or an aromatic ring system residue; X is a direct bond or oxygen; and m and n are independently selected from integers in the range of from 1 to about 10.

Examples of the aromatic compound functionalized with one or more ether group(s) and one or more allyl group(s) include, but not limited to

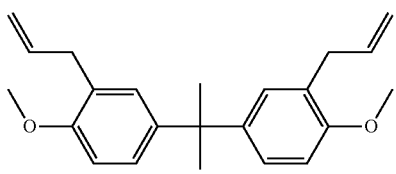 [SMILES: C=CCc1cc(C(C)(C)c2ccc(OC)c(CC=C)c2)ccc1OC]

and

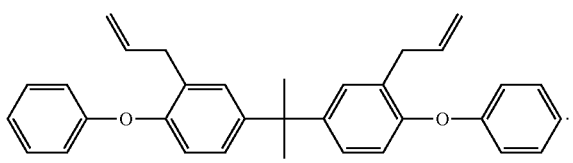 [SMILES: C=CCc1cc(C(C)(C)c2ccc(Oc3ccccc3)c(CC=C)c2)ccc1Oc1ccccc1]

The ether group of the aromatic compound functionalized with one or more ether group(s) and one or more allyl group(s) may be an epoxy ether or an oxetane ether. Examples of the aromatic compound functionalized with one or more epoxy ether or oxetane ether group(s) and one or more allyl group(s) include, but not limited to

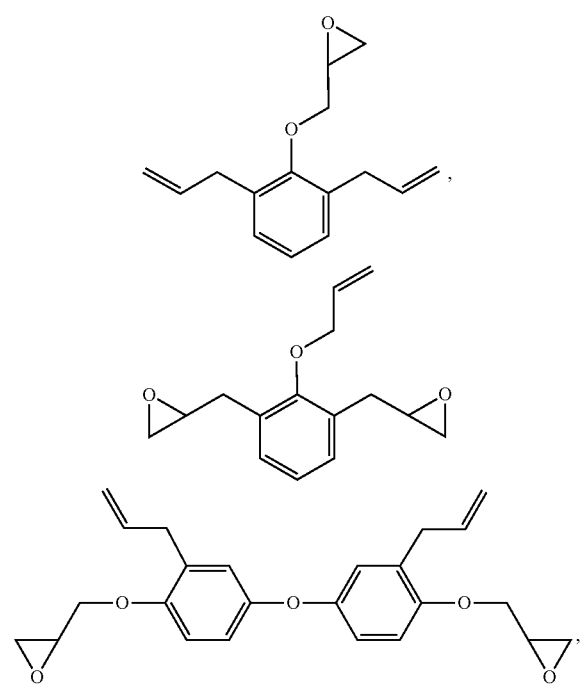

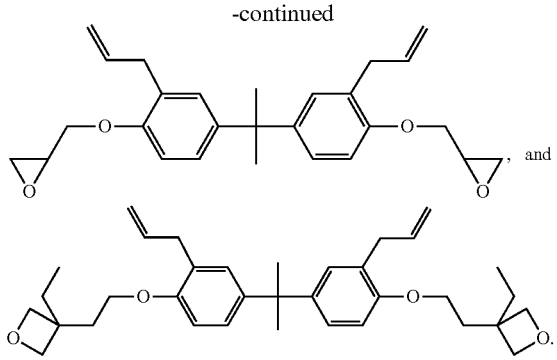

For those skilled in the art, a substituted allyl group such as crotyl, γ-methylcrotyl or 2-pentenyl group may be used in place of the allyl group so-described above.

The thermally conductive filler may be selected from a host of materials, known in the art and many of which being commercially available. See e.g. U.S. Pat. No. 6,169,142 (col. 4, lines 7-33). The thermally conductive filler may be both thermally conductive and electrically conductive. Alternatively, thermally conductive filler may be thermally conductive and electrically insulating. Classes of thermally conductive fillers include a metallic filler, an inorganic filler, a carbon-based filler, a thermally conductive polymer particle filler, or combinations thereof.

Metallic fillers include particles of metals and particles of metals having layers on the surfaces of the particles. These layers may be, for example, metal nitride layers or metal oxide layers on the surfaces of the particles. Suitable metallic fillers are exemplified by particles of metals selected from aluminum, copper, gold, nickel, silver, and combinations thereof. Suitable metallic fillers are further exemplified by particles of the metals listed above having layers on their surfaces selected from aluminum nitride, aluminum oxide, copper oxide, nickel oxide, silver oxide, and combinations thereof. For example, the metallic filler may comprise aluminum particles having aluminum oxide layers on their surfaces.

Inorganic fillers are exemplified by metal oxides such as aluminum oxide, beryllium oxide, magnesium oxide, and zinc oxide; nitrides such as aluminum nitride and boron nitride; carbides such as silicon carbide and tungsten carbide; and combinations thereof. Other examples include aluminum trihydrate, silicone dioxide, barium titanate, and magnesium hydroxide.

Carbon based fillers include carbon fibers, diamond, graphite. Carbon nanostructured materials, such as one-dimensional carbon nanotubes and two-dimensional graphene and graphite nanoplatelets may be used in the composition due to their high intrinsic thermal conductivity.

Examples of thermally conductive polymer filler include oriented polyethylene fibers and nanocellulose, polythiophene such as those described in V. Singh et. al., "High thermal conductivity of chain-oriented amorphous polythiophene", *Nature Nanotechnology*, Vol. 9, 384 (2014), as well as liquid crystal polymers, such as those described in S. Yoshihara et. al., "Main-chain smectic liquid crystalline polymer exhibiting unusually high thermal conductivity in an isotropic composite", *J. Appl. Polym. Sci.*, Vol. 131, 39896 (2014).

The thermally conductive filler may be any shape. Round or spherical particles may minimize viscosity when higher loading levels are desired. Thermally conductive filler may be a single thermally conductive filler or a combination of two or more thermally conductive fillers that differ in at least one property such as particle shape, average particle size, particle size distribution, and type of filler. For example, it may be desirable to use a combination of inorganic fillers, such as a first aluminum oxide having a larger average particle size and a second aluminum oxide having a smaller average particle size. Alternatively, it may be desirable, for example, to use a combination of an aluminum oxide having a larger average particle size with a zinc oxide having a smaller average particle size; or it may be desirable to use combinations of metallic fillers, such as a first aluminum having a larger average particle size and a second aluminum having a smaller average particle size; or it may be desirable to use combinations of metallic and inorganic fillers, such as a combination of aluminum and aluminum oxide fillers, zinc oxide fillers. Use of a first filler having a larger average particle size and a second filler having a smaller average particle size than the first filler may improve packing efficiency, may reduce viscosity, and may enhance heat transfer.

The thermal conductive filler may also include a filler treating agent. The amount of filler treating agent may vary depending on various factors including the type and amounts of thermally conductive fillers. The filler may be treated with filler treating agent in situ or pretreated before being combined with the resin to make the composite.

The filler treating agent may be a silane such as an alkoxysilane, an alkoxy-functional oligosiloxane, a cyclic polyorganosiloxane, a hydroxyl-functional oligosiloxane, such as a dimethyl siloxane or methyl phenyl siloxane, a stearate, or a fatty acid. Alkoxysilane filler treating agents are known and include hexyltrimethoxysilane, octyltriethoxysilane, decyltrimethoxysilane, dodecyltrimethoxysilane, tetradecyltrimethoxysilane, phenyltrimethoxysilane, phenylethyltrimethoxysilane, octadecyltrimethoxysilane, octadecyltriethoxysilane, and combinations thereof.

The thermally conductive filler should be used in an amount of about 0.01 to about 20 weight equivalents, such as 0.5 to 10 weight equivalents, of the total amount of the resin.

In addition to thermally conductive fillers, other fillers may be added to achieve certain desired outcomes, such as electromagnetic interference or microwave absorbers, electrically-conductive fillers, and magnetic particles, as well fumed silicas that can influence rheology modification and fused silicas for coefficient of thermal expansion reduction.

In addition, a host of other additives can be added such as pigments, plasticizers, process aids, flame retardants, extenders, antioxidants, rheology modifiers, adhesion promotors. Representative adhesion promotors include alkoxysilyl compounds with additional reactive functionality, like alkenyl groups, (meth)acrylate groups, and epoxy groups. Examples of the adhesion promoters are

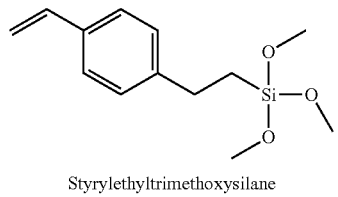

Styrylethyltrimethoxysilane

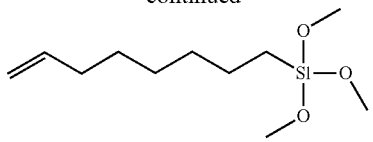

Octenyl trimethoxysilane

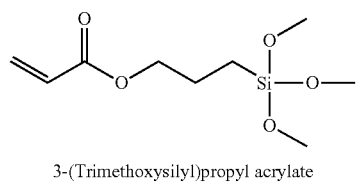

3-(Trimethoxysilyl)propyl acrylate

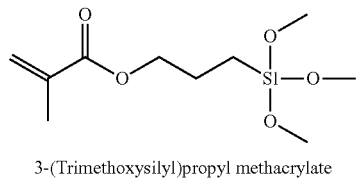

3-(Trimethoxysilyl)propyl methacrylate

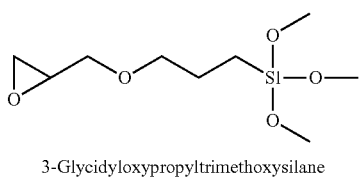

3-Glycidyloxypropyltrimethoxysilane

The adhesion promoters may be used in an amount of about 0.0001 to about 0.05 weight equivalent (0.01-5 percent by weight), based on the total resin mixture.

When disposing the inventive composition onto a desired substrate, the solvent should be capable of dissolving the resin mixture, maintaining a substantially homogenous composition that provides a substantially uniformly thick coating on the substrate, and be capable of evaporation at a temperature below about 140° C. without causing the composition to gel. In this way, good adhesion may be achieved on the substrates to be bonded or laminated.

In another aspect, the invention provides a composition of matter that includes:
(a) a first compound having two functional groups selected from maleimides, nadimides or itaconimides; and
(b) an ether- and allyl-functionalized aromatic compound where the aromatic compound has two ether functional groups and two allyl groups.

The first compound and the ether- and allyl-functionalized aromatic compound are described above. Nonetheless, in the inventive composition of matter the first compound of (a) may be

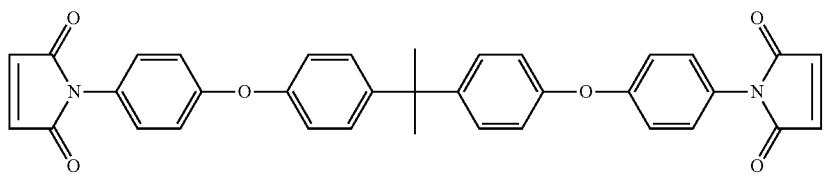 [SMILES: CC(C)(c1ccc(Oc2ccc(N3C(=O)C=CC3=O)cc2)cc1)c1ccc(Oc2ccc(N3C(=O)C=CC3=O)cc2)cc1]

and the ether- and allyl-functionalized aromatic compound of (b) may be

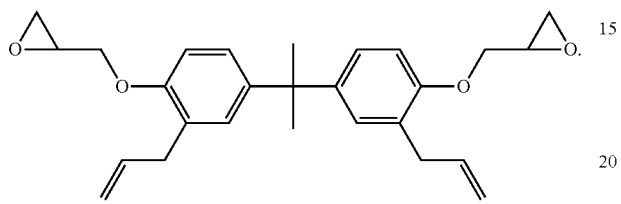

In the composition of matter, the first compound of (a) comprises a molar ratio of the first compound (a)(i) to the aromatic compound functionalized with one or more ether group(s) and one or more allyl group(s) (a)(ii) is from about 1:10 to about 10:1, such as about 1:5 to about 5:1, desirable about 1:2 to about 2:1.

In yet another aspect, the inventive composition may include a further compound to the resin of (a). That is, in addition to (i) a first compound having one or more functional groups selected from maleimides, nadimides or itaconimides; (ii) a second compound having one or more functional groups selected from maleimides, nadimides or itaconimides, where the second compound is different from the first compound; and (iii) an allyl-functionalized phenolic compound, the resin of (a) may include an ethynyl aryl compound.

Or in addition to (i) a first compound having one or more functional groups selected from maleimides, nadimides or itaconimides; and (ii) an aromatic compound functionalized with one or more ether group(s) and one or more allyl group(s), the resin of (a) may include an ethynyl aryl compound.

The ethynyl aryl compound may be represented by

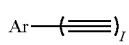

where Ar is an aromatic ring or an aromatic ring system residue and 1 is selected from integers in the range of from 1 to about 10, such as about 2.

Examples of an ethynyl aryl compounds include

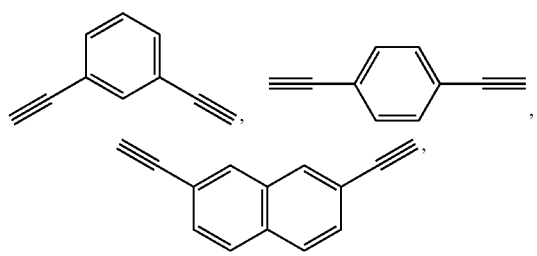

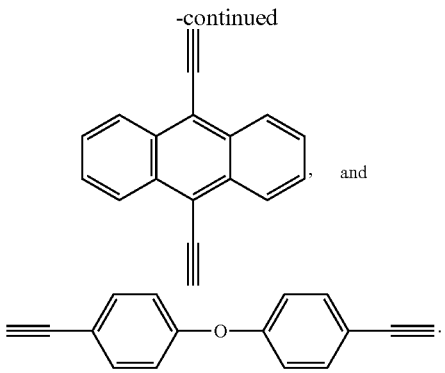

The inventive compositions may be prepared by mixing together in any order the compounds that make up resin (a), the thermally conductive filler (b) and the solvent (c). These constituents should be mixed together for a time and at a temperature sufficient to disperse the thermally conductive filler in a solution of the resin in the solvent. Once mixing is complete, the composition may be applied onto a surface of a substrate. The solvent may be allowed to evaporate at room temperature or the solvent may be driven off through active evaporative measures, either under vacuum or under modestly elevated temperature or both, to yield a B-staged film of the resin and thermally conductive filler on the substrate surface.

When the composition is applied to a base layer in order to form a combination with a circuit, the composition in the form of a film should be heated to cause the resin to react and form a reaction product of the inventive film. In such a configuration, a combination may be formed that includes (a) a circuit; (b) a reaction product of the inventive composition; and (c) a base layer. The circuit may ordinarily be constructed of copper. And the base layer is ordinarily constructed of a metal, such as aluminum or copper.

The present invention may be appreciated even more by reference to the example section that follows.

EXAMPLES

Example 1

A composition within the scope of the present invention (Sample A) was prepared using the components listed in Table 1 below in the amounts noted.

TABLE 1

| Components | Parts |
|---|---|
| 4,4'-Bismaleimidodiphenylmethane | 3.46 |
| 2,4-Bismaleimidotoluene | 1.90 |
| o,o'-Diallylbisphenol A | 3.94 |
| Polyimide-siloxane copolymer (STM1700) | 0.62 |

TABLE 1-continued

| Components | Parts |
| --- | --- |
| Epoxy silane adhesion promotor (Araldite DY 1158) | 0.08 |
| Aluminum oxide | 74.82 |
| Cyclohexanone | 15.17 |

Sample A was coated on a copper foil (TW-YE from Circuit Foil Trading, Inc.) using a 300-micron gap, dried at a temperature of 120° C. for a period of time of about 2 hours. The Sample A-coated foil was laminated to a tin-plated copper (pretreated with alkenyl silane) at a temperature of 215° C. for a period of time of about 3 hours at a pressure of about 1000 psi (6.89 MPa). Peel strength of the so-formed laminate was evaluated at a series of temperatures and captured in Table 2 below.

TABLE 2

| Temp. (C.) | Peel strength (N/mm) |
| --- | --- |
| 35 | 1.23 |
| 50 | 1.14 |
| 75 | 1.08 |
| 100 | 1.05 |
| 125 | 1.00 |
| 150 | 1.00 |
| 175 | 0.93 |
| 200 | 0.89 |
| 225 | 0.86 |
| 250 | 0.81 |
| 300 | 0.53 |

A peel strength of over 0.88 N/mm is desirable. As shown in Table 2, Sample A achieves this level of peel strength at least up to a temperature of 200° C.

Example 2

Sample A was applied to two other copper foils and laminated to untreated copper base plate. In each All demonstrated sufficient peel strength at room temperature as shown below in Table 3.

TABLE 3

| Copper Foil | Peel strength (N/mm) | Failure Mode |
| --- | --- | --- |
| TWLS | 1.26 | Adhesion to foil failure |
| BF-TZA | 1.31 | Partial adhesion to copper plate failure |
| TW-YE | 1.09 | Adhesion to foil failure |

Example 3

Sample A was dried at various temperatures for a period of time of 75 minutes, then laminated under the same conditions as described above in Example 1. The various drying temperatures and peel strengths observed are recorded in Table 4 below. The complete loss of adhesion at a drying/solvent removal condition of a temperature of 150° C. at 75 minutes indicates that a curing reaction occurred, which is undesirable.

TABLE 4

| Drying temperature (° C.) | Peel strength (N/mm) |
| --- | --- |
| 120 | 1.09 |
| 130 | 1.12 |
| 140 | 1.12 |
| 150 | 0 |

Example 4

Example 1 was repeated though cyclopentanone was used as a solvent in Sample B as a replacement for cyclohexanone. After preparation, Sample B was coated on copper foil TW-YE using a 300-micron gap, and then dried at a temperature of 120° C. for a period of time of 2 hours. The Sample B-coated foil A was laminated to a tin-plated copper (no silane treatment on surface) at a temperature of 215° C. for a period of time of about 3 hours at a pressure of about 1000 psi (6.89 MPa). Peel strength of the so-formed laminate was evaluated 1.09 N/mm.

Example 5

Formulations containing dimethylformamide or dimethylacetamide as a solvent were prepared under the same conditions as Example 4, with the components listed in Table 5 below.

TABLE 5

| Components | Parts |
| --- | --- |
| 4,4'-Bismaleimidodiphenylmethane | 3.46 |
| 2,4-Bismaleimidotoluene | 1.90 |
| o,o'-Diallylbisphenol A | 3.94 |
| Epoxy silane adhesion promotor (Araldite DY 1158) | 0.08 |
| Aluminum oxide | 74.82 |
| Solvent | 15.17 |

After application onto copper foil TW-YE and lamination as above, peel strengths at room temperature of 1.40 N/mm and 0.98 N/mm, respectively, were observed for the formulations with the noted solvents. Both samples gave sufficient adhesion and demonstrated that these are suitable solvents.

Example 6

To evaluate thermal stability, the Thermogravimetric Index (TGI) of the cured samples was measured. TGI is based on National Electrical Manufacturer's Association test method RE-1 using a Thermogravimetric Analyzer (TGA) in air. For internal comparison purposes, TGI is defined as: TGI=0.35 $T_{20}$+0.07 $T_{50}$, where $T_{20}$=the temperature at which 20% weight loss occurs and $T_{50}$=the temperature at which 50% weight loss occurs.

TGI is an indication of the maximum in service temperature over product lifetime for a specific material. The target TGI is over 200° C. Sample A was found to have a TGI index of 211° C.

Example 7

A composition within the scope of the present invention (Sample C) was prepared using the components listed in Table 6 below in the amounts noted.

TABLE 6

| Components | Parts |
| --- | --- |
| Diallyl Bisphenol-A Diglycidyl Ether | 1.65 |
| 2,2-Bis[4-(4-maleimidophenoxy)phenyl]propane | 2.76 |
| Epoxy silane adhesion promotor (Araldite DY 1158) | 0.04 |
| Aluminum oxide | 36 |
| Cyclohexanone | 6.2 |

Sample C was coated on a copper foil TW-YW using a 300-micron gap, dried at a temperature of 120° C. for a period of time of about 2 hours. The Sample C-coated foil A was laminated to a tin-plated copper (no silane surface treatment) at a temperature of 215° C. for a period of time of about 3 hours at a pressure of about 1000 psi (6.89 MPa). Peel strength of the so-formed laminate was evaluated at room temperature and determined to be 1.70 N/mm.

Example 8

Several compositions within the scope of the present invention (Samples D-H) were prepared using the components listed in Table 7 below in the amounts noted. Each of the samples was dissolved in propylene glycol mono ether acetate ("PGMEA").

TABLE 7

| Constituents | Sample/Amt (grams) | | | | |
| --- | --- | --- | --- | --- | --- |
| | D | E | F | G | H |
| Diallyl Bisphenol-A Diglycidyl Ether | 1.54 | 1.54 | 1.46 | 1.38 | 1.38 |
| 2,2-Bis[4-(4-maleimidophenoxy)phenyl]propane | 5.7 | 5.7 | 5.7 | 5.7 | 5.7 |
| 1,3-Diethynyl benzene | — | 0.08 | 0.08 | 0.08 | 0.16 |

The samples were each applied to a substrate and exposed to a temperature of 120° C. a period of time of about 2 hours, after which time the solvent was evaporated. The compositions were cured by exposure to a temperature of 250° C. a period of time of about 2 hours. TGI was determined for each sample and recorded below in Table 8.

TABLE 8

| Sample | TGI |
| --- | --- |
| D | 218 |
| E | 225 |
| F | 225 |
| G | 227 |
| H | 223 |

The addition of the ethynyl aryl compound to the samples improved TGI by 5° C. or more, even at low amounts.

What is claimed is:

1. A composition comprising:
   (a) A resin comprising:
      (i) a first compound having one or more functional groups selected from maleimides, nadimides or itaconimides;
      (ii) an aromatic compound functionalized with one or more ether group(s) and one or more allyl group(s); and
      (iii) an ethynyl aryl compound;
   (b) a thermally conductive filler in an amount of about 0.01 to about 20 weight equivalents of the total resin; and
   (c) a solvent selected from cycloalkanones, dialkyl formamides, dialkyl acetamides, and combinations thereof.

2. The composition of claim 1, wherein the resin of (a) comprises:
   (i) a first compound having two functional groups selected from maleimides, nadimides or itaconimides; and
   (ii) an aromatic compound functionalized with two ether groups and two allyl groups.

3. The composition of claim 1, wherein the resin of (a) comprises:

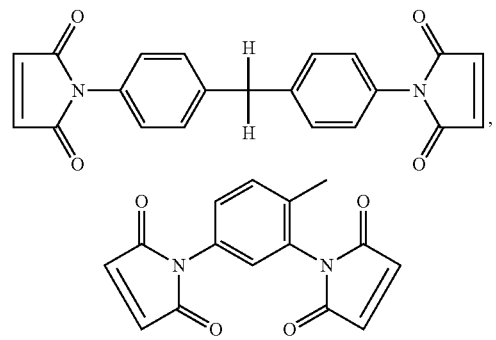

and

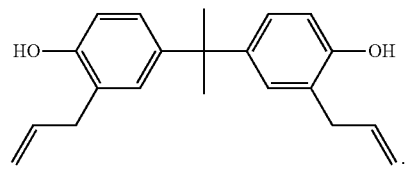 [SMILES: C=CCc1cc(C(C)(C)c2ccc(O)c(CC=C)c2)ccc1O]

4. The composition of claim 1, wherein the resin of (a) comprises:

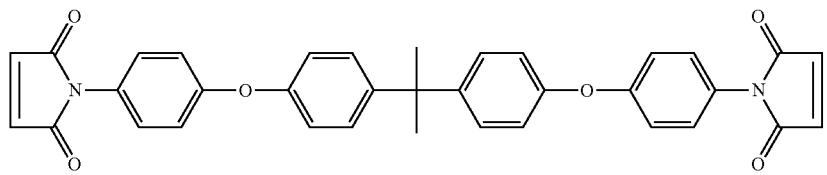

and

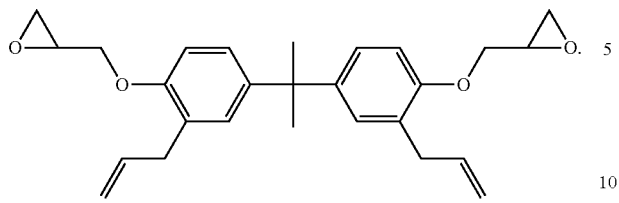

5. The composition of claim 1, wherein the resin of (a) comprises a molar ratio of the first compound (a) (i) to the aromatic compound functionalized with one or more ether group(s) and one or more allyl group(s) (a) (ii) is from about 1:10 to about 10:1.

6. The composition of claim 1, wherein the resin of (a) comprises a molar ratio of the first compound (a) (i) to the aromatic compound functionalized with one or more ether group(s) and one or more allyl group(s) (a) (ii) is from about 1:2 to about 2:1.

7. The composition of claim 1, wherein the solvent of (c) has a boiling point of less than or equal about 165° C. at 1 atmosphere pressure.

8. The composition of claim 1, wherein the solvent of (c) is selected from the group consisting of cyclopentanone, cyclohexanone, and combinations thereof.

9. The composition of claim 1, wherein the solvent of (c) is present in an amount of about 10 to about 90 percent by weight, based on total composition.

10. The composition of claim 1, wherein the aromatic compound functionalized with one or more ether group(s) and one or more allyl group(s) is embraced by the following generic structure:

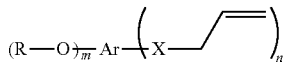

wherein R is a radical selected from the group consisting of oxetanyl, glycidyl, or $C_{1-4}$ alkyl or $C_6$-10 aryl; Ar is an aromatic ring or an aromatic ring system residue; X is a direct bond or oxygen; and m and n are independently selected from integers in the range of from 1 to about 10.

11. The composition of claim 1, wherein the aromatic compound functionalized with one or more ether group(s) and one or more allyl group(s) is selected from one or more of

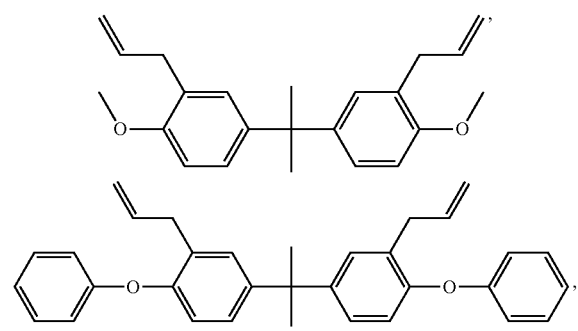

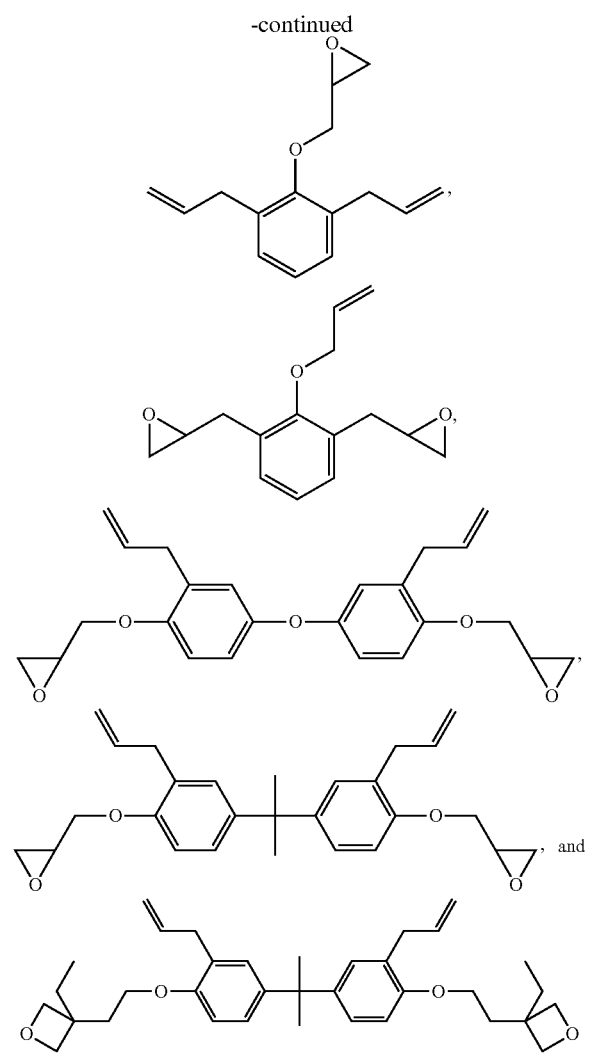

12. A composition comprising:
(a) A resin comprising:
  (i) a first compound having one or more functional groups selected from maleimides, nadimides or itaconimides; and
  (ii) an aromatic compound functionalized with one or more ether group(s) and one or more allyl group(s);
(b) a thermally conductive filler in an amount of about 0.01 to about 20 weight equivalents of the total resin; and
(c) a solvent selected from cycloalkanones, dialkyl formamides, dialkyl acetamides, and combinations thereof
wherein the resin of (a) further comprises an ethynyl aryl compound represented by

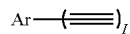

wherein Ar is an aromatic ring or an aromatic ring system residue and l is selected from integers in the range of from 1 to about 10.

* * * * *